(12) United States Patent
Bergendahl et al.

(10) Patent No.: US 10,141,230 B2
(45) Date of Patent: Nov. 27, 2018

(54) METHOD AND STRUCTURE TO ENABLE DUAL CHANNEL FIN CRITICAL DIMENSION CONTROL

(71) Applicant: International Business Machines Corporation, Armonk, NY (US)

(72) Inventors: Marc A. Bergendahl, Troy, NY (US); Kangguo Cheng, Schenectady, NY (US); John R. Sporre, Albany, NY (US); Sean Teehan, Rensselaer, NY (US)

(73) Assignee: International Business Machines Corproation, Armonk, NY (US)

( * ) Notice: Subject to any disclaimer, the term of this patent is extended or adjusted under 35 U.S.C. 154(b) by 0 days.

(21) Appl. No.: 15/609,563

(22) Filed: May 31, 2017

(65) Prior Publication Data

US 2017/0365525 A1 Dec. 21, 2017

Related U.S. Application Data

(62) Division of application No. 15/187,152, filed on Jun. 20, 2016, now Pat. No. 9,768,075.

(51) Int. Cl.

| H01L 21/70 | (2006.01) |
|---|---|
| H01L 21/8238 | (2006.01) |
| H01L 27/092 | (2006.01) |
| H01L 29/10 | (2006.01) |
| H01L 29/16 | (2006.01) |
| H01L 29/161 | (2006.01) |

(Continued)

(52) U.S. Cl.
CPC ........... *H01L 21/823807* (2013.01); *H01L 21/02532* (2013.01); *H01L 21/02609* (2013.01); *H01L 21/3065* (2013.01); *H01L 21/823821* (2013.01); *H01L 27/0924* (2013.01); *H01L 29/045* (2013.01); *H01L 29/1054* (2013.01); *H01L 29/16* (2013.01); *H01L 29/161* (2013.01)

(58) Field of Classification Search
None
See application file for complete search history.

(56) References Cited

U.S. PATENT DOCUMENTS 7,803,670 B2   9/2010 White et al.
7,842,559 B2   11/2010 Jakschik et al.
(Continued)

OTHER PUBLICATIONS

List of IBM Patents or Patent Applications Treated as Related.

*Primary Examiner* — Cory Eskridge
(74) *Attorney, Agent, or Firm* — Vazken Alexanian; Ryan, Mason & Lewis, LLP

(57) ABSTRACT

A method for manufacturing a semiconductor device includes forming a first semiconductor layer on a substrate having a {100} crystallographic surface orientation, forming a second semiconductor layer on the substrate, patterning the first semiconductor layer and the second semiconductor layer into a first plurality of fins and a second plurality of fins, respectively, wherein the first and second plurality of fins extend vertically with respect to the substrate, covering the first plurality of fins and a portion of the substrate corresponding to the first plurality of fins, and epitaxially growing semiconductor layers on exposed portions of the second plurality of fins and on exposed portions of the substrate, wherein the epitaxially grown semiconductor layers on the exposed portions of the second plurality of fins increase a critical dimension of each of the second plurality of fins.

20 Claims, 7 Drawing Sheets

(51) Int. Cl.
*H01L 29/04* (2006.01)
*H01L 21/02* (2006.01)
*H01L 21/3065* (2006.01)

(56) References Cited

U.S. PATENT DOCUMENTS

| | | |
|---|---|---|
| 7,960,287 B2 | 6/2011 | Johnson et al. |
| 8,003,466 B2 | 8/2011 | Shi et al. |
| 8,106,381 B2 | 1/2012 | Atanackovic |
| 8,609,550 B2 | 12/2013 | Moroz et al. |
| 8,673,165 B2 | 3/2014 | Raghunathan et al. |
| 8,765,563 B2 | 7/2014 | Pillarisetty et al. |
| 2004/0256647 A1 | 12/2004 | Lee et al. |
| 2007/0069302 A1 | 3/2007 | Jin et al. |
| 2008/0020515 A1 | 1/2008 | White et al. |
| 2013/0270641 A1 | 10/2013 | Chi |
| 2014/0110767 A1 | 4/2014 | Anderson et al. |
| 2015/0187947 A1 | 7/2015 | Chi et al. |
| 2016/0099342 A1 | 4/2016 | Basker et al. |

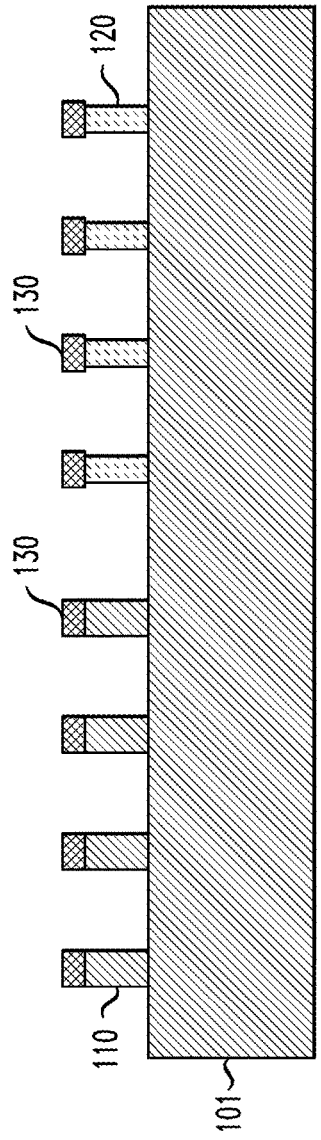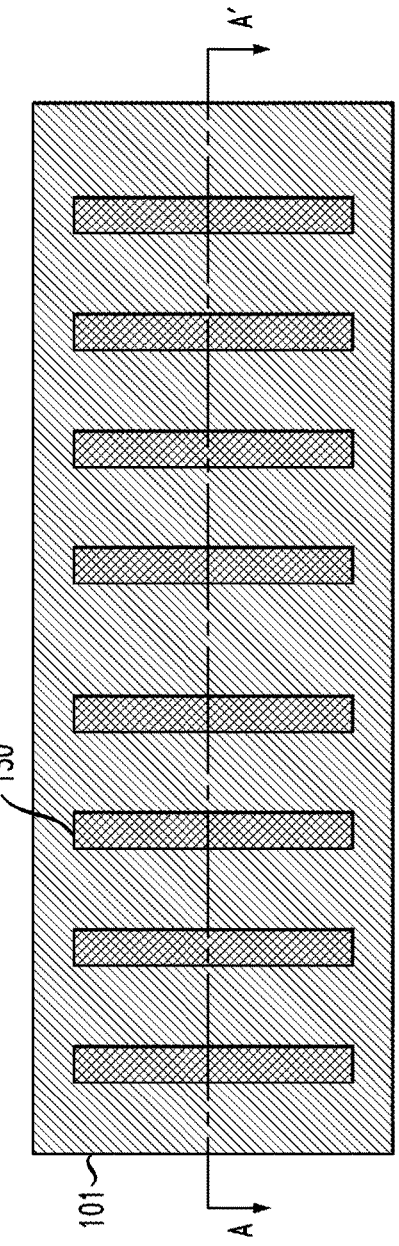

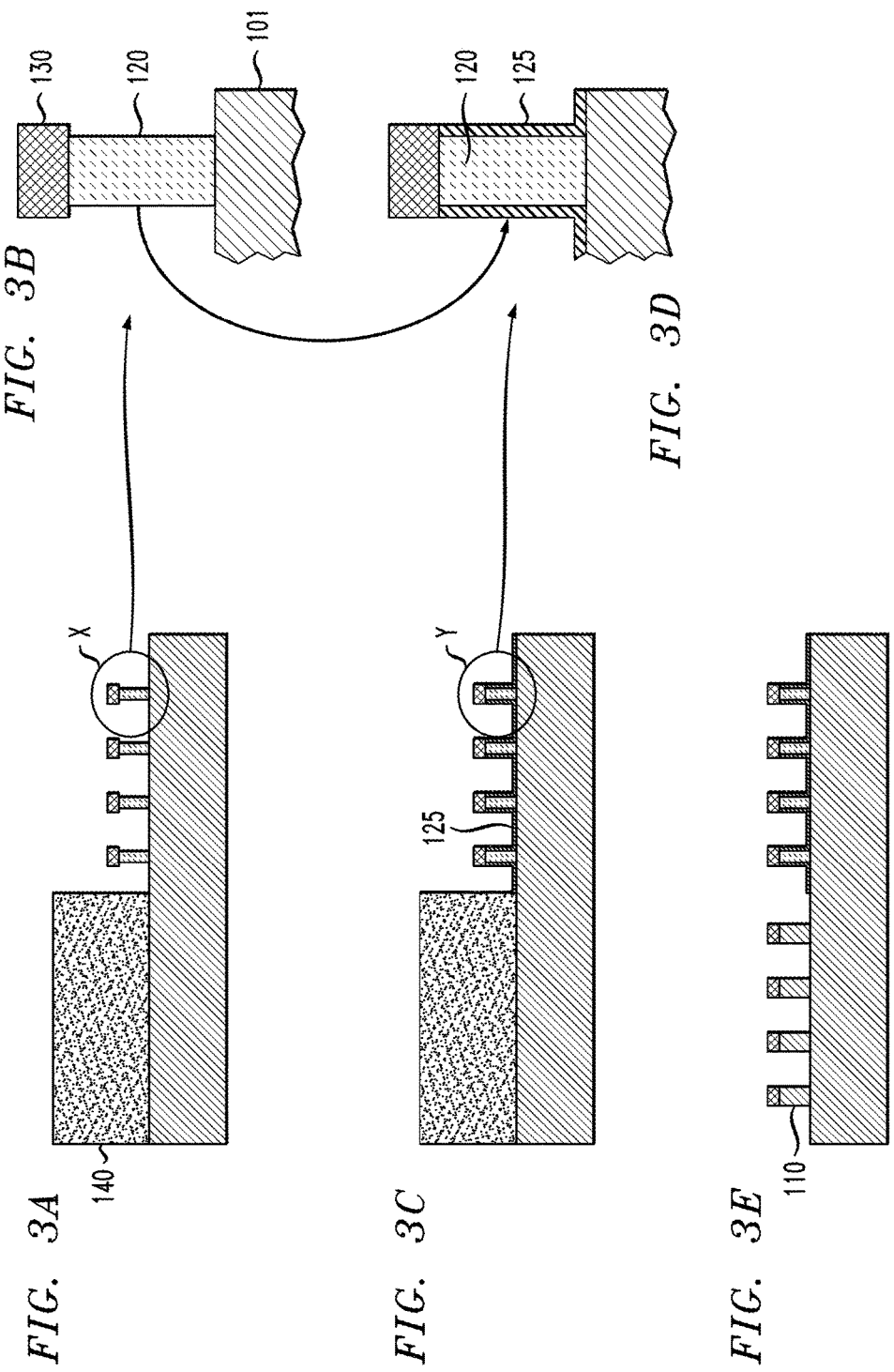

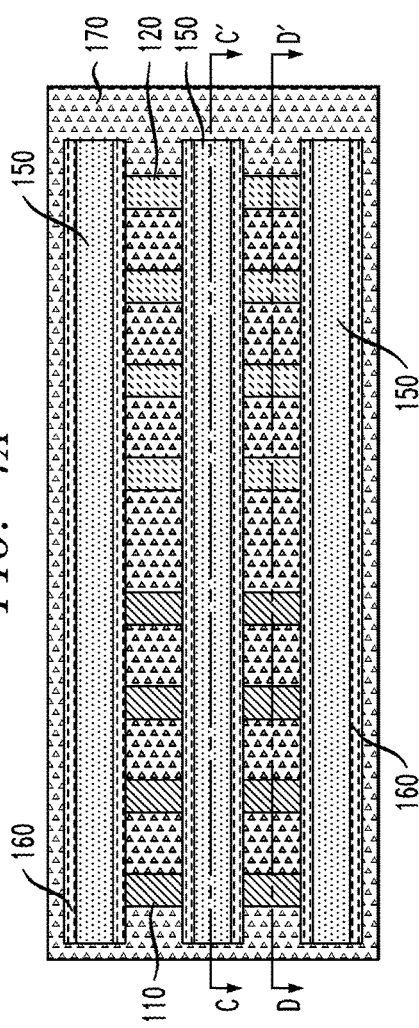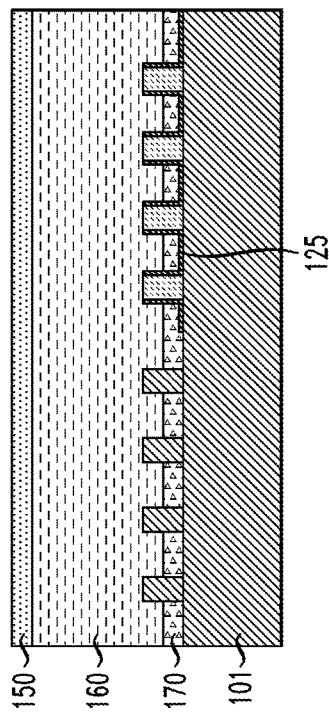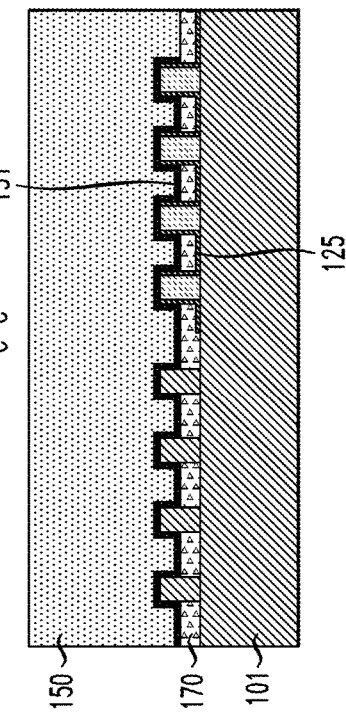

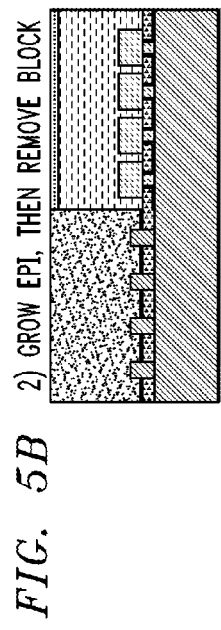
FIG. 5A  1) BLOCK nFET
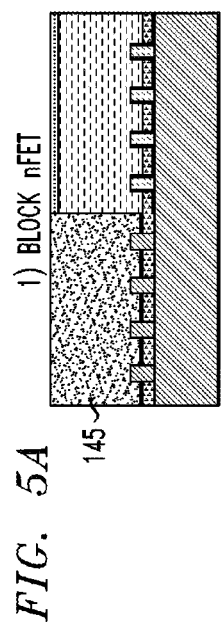
FIG. 5B  2) GROW EPI, THEN REMOVE BLOCK
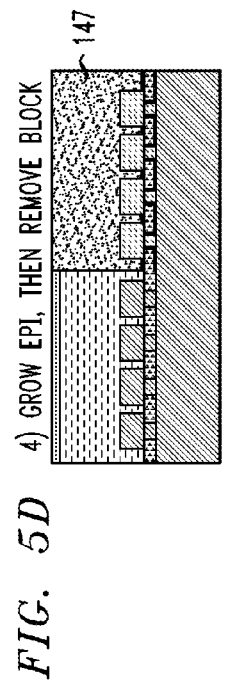
FIG. 5C  3) BLOCK pFET
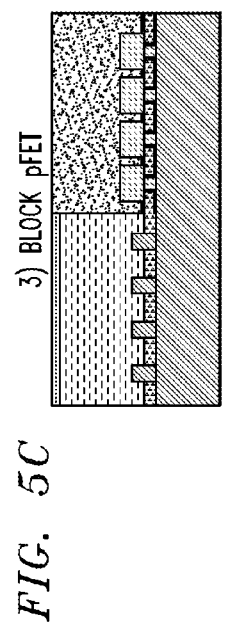
FIG. 5D  4) GROW EPI, THEN REMOVE BLOCK
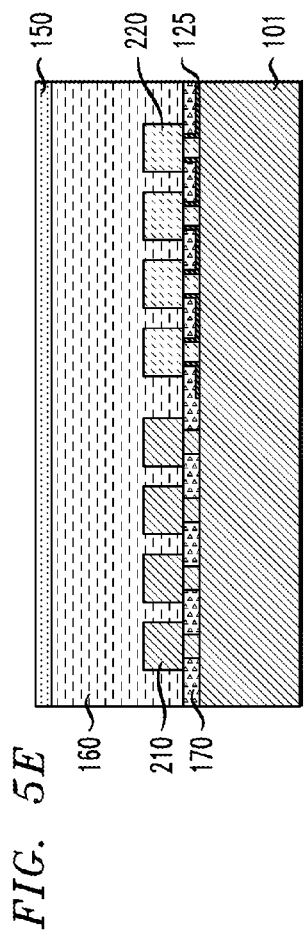
FIG. 5E

METHOD AND STRUCTURE TO ENABLE DUAL CHANNEL FIN CRITICAL DIMENSION CONTROL

TECHNICAL FIELD

The field generally relates to semiconductor devices and methods of manufacturing same and, in particular, to forming fins comprising different materials on a substrate so that the fins have the same or substantially the same lateral critical dimension (CD).

BACKGROUND

Fin field-effect transistor (FinFET) devices include a transistor architecture that uses raised source-to-drain channel regions, referred to as fins. A FinFET device can be built on a semiconductor substrate, where a semiconductor material, such as silicon, is patterned into fin-like shapes and functions as the channels of the transistors.

Known methods for manufacturing dual channel FinFET devices include etching channels for p-type field-effect transistors (PFETs) and n-type field-effect transistors (NFETs) during the same reactive ion etch (RIE) step. In a case where NFET fins comprise silicon (Si) and PFET fins comprise silicon germanium (SiGe), there is a variation of fin critical dimensions (CDs) between NFET and PFET devices due to the dissimilar etch rates between Si and SiGe. The variation results in undesirable electrical properties for the resulting transistors.

SUMMARY

According to an exemplary embodiment of the present invention, a method for manufacturing a semiconductor device includes forming a first semiconductor layer on a substrate having a {100} crystallographic surface orientation, forming a second semiconductor layer on the substrate, patterning the first semiconductor layer and the second semiconductor layer into a first plurality of fins and a second plurality of fins, respectively, wherein the first and second plurality of fins extend vertically with respect to the substrate, covering the first plurality of fins and a portion of the substrate corresponding to the first plurality of fins, and epitaxially growing semiconductor layers on exposed portions of the second plurality of fins and on exposed portions of the substrate, wherein the epitaxially grown semiconductor layers on the exposed portions of the second plurality of fins increase a critical dimension of each of the second plurality of fins.

According to an exemplary embodiment of the present invention, a semiconductor device includes a substrate having a {100} crystallographic surface orientation, a first plurality of fins comprising a first semiconductor material, a second plurality of fins comprising a second semiconductor material different from the first semiconductor material, wherein the first and second plurality of fins extend vertically with respect to the substrate, and the first and second plurality of fins have the same or substantially the same lateral critical dimension as each other.

According to an exemplary embodiment of the present invention, a method for manufacturing a semiconductor device includes forming a first semiconductor layer on a substrate having a {100} crystallographic surface orientation, forming a second semiconductor layer on the substrate, patterning the first semiconductor layer and the second semiconductor layer into a first plurality of fins and a second plurality of fins, respectively, wherein the first and second plurality of fins extend vertically with respect to the substrate, depositing a blocking material on the first plurality of fins and on a portion of the substrate corresponding to the first plurality of fins to cover the first plurality of fins and the portion of the substrate corresponding to the first plurality of fins, epitaxially growing semiconductor layers on exposed portions of the second plurality of fins and on exposed portions of the substrate, wherein the epitaxially grown semiconductor layers on the exposed portions of the second plurality of fins increase a critical dimension of each of the second plurality of fins to be the same or substantially the same as a critical dimension of each of the first plurality of fins, and removing the blocking material.

These and other exemplary embodiments of the invention will be described in or become apparent from the following detailed description of exemplary embodiments, which is to be read in connection with the accompanying drawings.

BRIEF DESCRIPTION OF THE DRAWINGS

Exemplary embodiments of the present invention will be described below in more detail, with reference to the accompanying drawings, of which:

FIG. 1B is a cross-sectional view taken along the line A-A' from FIG. 1C, illustrating formation of fins on a substrate in a method for manufacturing a semiconductor device, according to an exemplary embodiment of the present invention.

FIG. 1C is a top view illustrating formation of fins on a substrate in a method for manufacturing a semiconductor device, according to an exemplary embodiment of the present invention.

FIG. 3A is a cross-sectional view illustrating covering of NFET fins on a substrate in a method for manufacturing a semiconductor device, according to an exemplary embodiment of the present invention.

FIG. 3B is an enlarged view of the circled portion X in FIG. 3A, according to an exemplary embodiment of the present invention.

FIG. 3C is a cross-sectional view illustrating epitaxial growth of semiconductor layers on exposed surfaces, including fin sidewalls to increase critical dimensions of the fins, in a method for manufacturing a semiconductor device, according to an exemplary embodiment of the present invention.

FIG. 3D is an enlarged view of the circled portion Y in FIG. 3C, according to an exemplary embodiment of the present invention.

FIG. 3E is a cross-sectional view illustrating removal of a blocking material from NFET fins on a substrate in a method for manufacturing a semiconductor device, according to an exemplary embodiment of the present invention.

FIG. 4A is a top view illustrating formation of isolation, gate and spacer regions in a method for manufacturing a semiconductor device, according to an exemplary embodiment of the present invention.

FIG. 4B is a cross-sectional view taken along the line C-C' from FIG. 4A, illustrating formation of isolation and gate regions in a method for manufacturing a semiconductor device, according to an exemplary embodiment of the present invention.

FIG. 4C is a cross-sectional view taken along the line D-D' from FIG. 4A, illustrating formation of isolation, gate and spacer regions in a method for manufacturing a semiconductor device, according to an exemplary embodiment of the present invention.

FIGS. 5A-5E are cross-sectional views illustrating epitaxial growth around fins in a method for manufacturing a semiconductor device, according to an exemplary embodiment of the present invention.

DETAILED DESCRIPTION

Figure 1A:
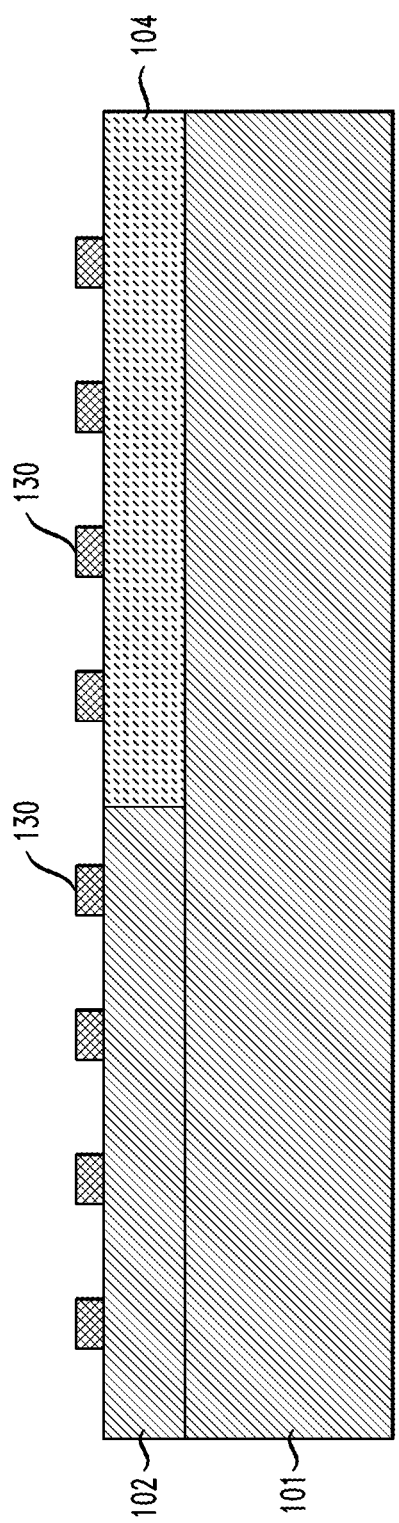
FIG. 1A is a cross-sectional view illustrating semiconductor layers on a substrate in a method for manufacturing a semiconductor device, according to an exemplary embodiment of the present invention.

Exemplary embodiments of the invention will now be discussed in further detail with regard to semiconductor devices and methods of manufacturing same and, in particular, to the formation of channel regions, wherein the channel regions comprise different materials and have the same or substantially the same lateral critical dimension (CD).

Embodiments of the present invention relate to forming fins comprising Si and SiGe on a substrate having a {100} crystallographic surface orientation ("{100} type substrate") so that the fins comprising the Si and SiGe have the same or substantially the same lateral critical dimension (CD), with an added benefit of improved surface area exposure to contacts. As used herein, "substantially the same" refers to +/−5 angstroms.

In accordance with an embodiment, after a reactive ion etch (RIE) step, smaller SiGe PFET fins can be increased in lateral dimension independent of Si NFET fins. This method includes using a {100} type substrate comprising silicon, so that {100} oriented fins can be formed on the substrate. The {100} crystalline structure results in conformal growth of epitaxial Si and SiGe, in contrast to the diamond-shaped epitaxial growth of Si and SiGe on a substrate having a {110} crystallographic surface orientation ("{110} type substrate"). Non-diamond like (e.g., conformal) epitaxial growth provides a downstream processing benefit due to the ability to land a contact between the fin structures (explained further herein in connection with FIG. 6B), thereby increasing surface area contact between channel regions and contact structures. Embodiments of the present invention are able to compensate for fin structures having relatively large SiGe concentrations that result in even smaller critical dimensions due to the faster etch rate of SiGe when compared to that of Si.

It is to be understood that the various layers and/or regions shown in the accompanying drawings are not drawn to scale, and that one or more layers and/or regions of a type commonly used in complementary metal-oxide semiconductor (CMOS), fin field-effect transistor (FinFET), metal-oxide-semiconductor field-effect transistor (MOSFET) and/or other semiconductor devices may not be explicitly shown in a given drawing. This does not imply that the layers and/or regions not explicitly shown are omitted from the actual devices. In addition, certain elements may be left out of particular views for the sake of clarity and/or simplicity when explanations are not necessarily focused on the omitted elements. Moreover, the same or similar reference numbers used throughout the drawings are used to denote the same or similar features, elements, or structures, and thus, a detailed explanation of the same or similar features, elements, or structures will not be repeated for each of the drawings.

The semiconductor devices and methods for forming same in accordance with embodiments of the present invention can be employed in applications, hardware, and/or electronic systems. Suitable hardware and systems for implementing embodiments of the invention may include, but are not limited to, personal computers, communication networks, electronic commerce systems, portable communications devices (e.g., cell and smart phones), solid-state media storage devices, functional circuitry, etc. Systems and hardware incorporating the semiconductor devices are contemplated embodiments of the invention. Given the teachings of embodiments of the invention provided herein, one of ordinary skill in the art will be able to contemplate other implementations and applications of embodiments of the invention.

The embodiments of the present invention can be used in connection with semiconductor devices that may require CMOSs, MOSFETs and/or FinFETs. By way of non-limiting example, the semiconductor devices can include, but are not limited to CMOS, MOSFET and FinFET devices, and/or semiconductor devices that use CMOS, MOSFET and/or FinFET technology.

As used herein, "height" refers to a vertical size of an element (e.g., a layer, trench, hole, etc.) in the cross-sectional views measured from a bottom surface to a top surface of the element, and/or measured with respect to a surface on which the element is directly on. Conversely, a "depth" refers to a vertical size of an element (e.g., a layer, trench, hole, etc.) in the cross-sectional and three-dimensional views measured from a top surface to a bottom surface of the element.

As used herein, "lateral," "lateral side," "lateral surface" refers to a side surface of an element (e.g., a layer, opening, etc.), such as a left or right side surface in the drawings.

As used herein, "width" or "length" refers to a size of an element (e.g., a layer, trench, hole, etc.) in the drawings measured from a side surface to an opposite surface of the element.

As used herein, terms such as "upper", "lower", "right", "left", "vertical", "horizontal", "top", "bottom", and derivatives thereof shall relate to the disclosed structures and methods, as oriented in the drawing figures. For example, as used herein, "vertical" refers to a direction perpendicular to a substrate in the cross-sectional views, and "horizontal" refers to a direction parallel to a substrate in the cross-sectional views.

As used herein, unless otherwise specified, terms such as "on", "overlying", "atop", "on top", "positioned on" or "positioned atop" mean that a first element is present on a second element, wherein intervening elements may be present between the first element and the second element. As used herein, unless otherwise specified, the term "directly" used in connection with the terms on", "overlying", "atop", "on top", "positioned on" or "positioned atop" or the term "direct contact" mean that a first element and a second element are connected without any intervening elements, such as, for example, intermediary conducting, insulating or semiconductor layers, present between the first element and the second element.

FIG. 1A is a cross-sectional view illustrating semiconductor layers on a substrate in a method for manufacturing a semiconductor device, according to an exemplary embodiment of the present invention. Referring to FIG. 1A, a semiconductor substrate 101 can be, for example, a silicon substrate having a {100} crystallographic surface orientation. The material of the substrate 101 is not necessarily limited to silicon, and can include, for example, gallium arsenide (GaAs), or other like semiconductor. In accordance with an embodiment of the present invention, semiconductor layers 102 and 104 respectively including, but not necessarily limited to, Si and SiGe are epitaxially grown on the substrate 101.

Terms such as "epitaxial growth" and "epitaxially formed and/or grown" refer to the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed. For example, an epitaxial semiconductor material deposited on a {100} crystal surface will take on a {100} orientation.

Examples of various epitaxial growth processes include, for example, rapid thermal chemical vapor deposition (RTCVD), low-energy plasma deposition (LEPD), ultra-high vacuum chemical vapor deposition (UHVCVD), atmospheric pressure chemical vapor deposition (APCVD), liquid-phase epitaxy (LPE), molecular beam epitaxy (MBE) and metal-organic chemical vapor deposition (MOCVD). The temperature for an epitaxial growth process can range from, for example, 550° C. to 900° C., but is not necessarily limited thereto, and may be conducted at higher or lower temperatures as needed.

A number of different sources may be used for the epitaxial growth. For example, the sources may include precursor gas or gas mixture including for example, a silicon containing precursor gas (such as silane) and/or a germanium containing precursor gas (such as a germane). Carrier gases like hydrogen, nitrogen, helium and argon can be used.

FIG. 1B is a cross-sectional view taken along the line A-A' from FIG. 1C, and FIG. 1C is a top view illustrating formation of fins on a substrate in a method for manufacturing a semiconductor device, according to an exemplary embodiment of the present invention. A fin of a FinFET can include, for example, silicon or silicon germanium, and is a conducting channel that protrudes vertically from a substrate and conducts in a direction from a source to a drain. As can be understood by one of ordinary skill in the art, a plurality of fins can be formed on the substrate 101 and spaced apart from each other at regular intervals. A plurality of gates can intersect the fins.

Referring to FIGS. 1A-1C, fins, such as a fin 110 and a fin 120, can be formed by patterning the epitaxially grown semiconductor layers 102, 104 into the fins 110 and 120. Hardmasks 130 including, for example, a dielectric material, such as silicon nitride (SiN) are formed on portions that are to be formed into the fins 110, 120. The fin patterning can be done by a spacer image transfer (SIT) process, for example. The SIT process includes using lithography to form a pattern referred to as a mandrel. The mandrel material can include, but is not limited to, amorphous silicon or amorphous carbon. After the mandrel formation, a conformal film can be deposited and then followed by an etchback. The conformal film will form spacers at both sides of the mandrel. The spacer material can include, but is not limited, oxide or SiN. After that, the mandrel can be removed by reactive ion etching (RIE) processes. As a result, the spacers will have half the pitch of the mandrel. In other words, the pattern is transferred from a lithography defined mandrel to spacers, where the pattern density is doubled. The spacer pattern can be used as the hardmasks 130 to form the fins 110, 120 by an RIE process. According to an embodiment, the fins can be patterned to a height of about 20 nm to about 50 nm.

As noted above, if the fins 110 comprise silicon, and the fins 120 comprise SiGe, there is a variation of fin CDs between fins 110 and 120 due to the dissimilar etch rates between Si and SiGe, where SiGe is etched faster than Si. As a result, after the RIE process to form the fins 110, 120, the lateral CD of the fins 120 is less than the lateral CD of the fins 110 as shown by the thinner fins 120 in FIG. 1B.

Figure 2A:
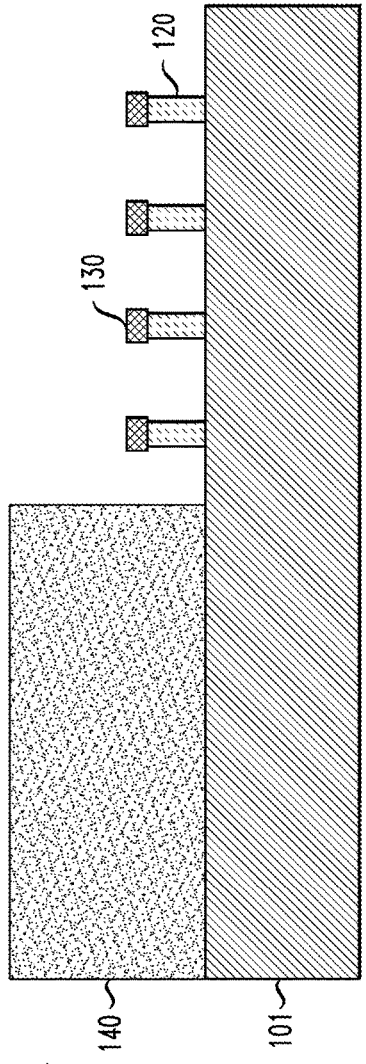
FIG. 2A is a cross-sectional view taken along the line B-B' from FIG. 2B, illustrating covering of NFET fins on a substrate in a method for manufacturing a semiconductor device, according to an exemplary embodiment of the present invention.
Figure 2B:
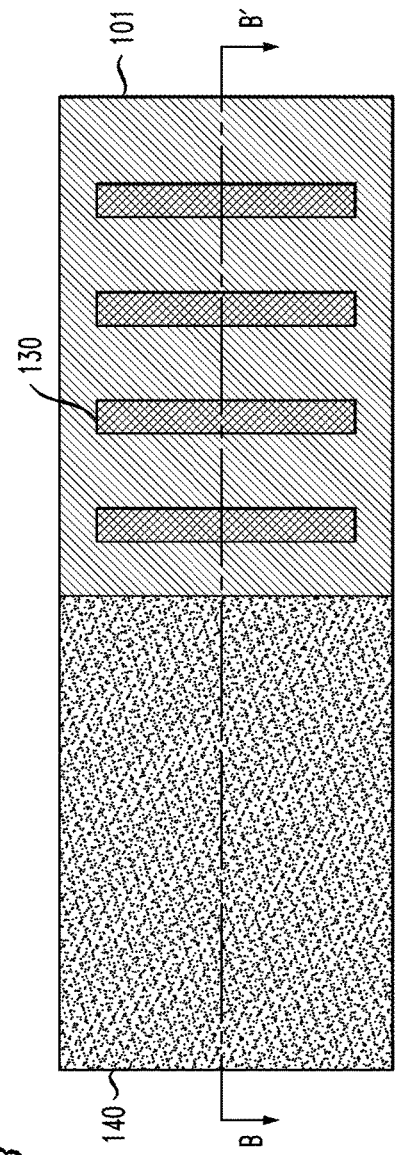
FIG. 2B is a top view illustrating covering of NFET fins on a substrate in a method for manufacturing a semiconductor device, according to an exemplary embodiment of the present invention.

FIG. 2A is a cross-sectional view taken along the line B-B' from FIG. 2B, and FIG. 2B is a top view, illustrating covering of NFET fins on a substrate in a method for manufacturing a semiconductor device, according to an exemplary embodiment of the present invention. Referring to FIG. 2A, the fins 110, which are to be used for NFETs, are covered by a block 140 comprising, for example, an organic planarization layer (OPL), and the fins 120, which are to be used for PFETs remain exposed. In accordance with an embodiment of the present invention, the OPL material may be an organic polymer including C, H, and N. In an embodiment, the OPL material can be free of silicon (Si). According to an embodiment, the OPL material can be free of Si and fluorine (F). As defined herein, a material is free of an atomic element when the level of the atomic element in the material is at or below a trace level detectable with analytic methods available in the art. Non-limiting examples of the OPL material include JSR HM8006, JSR HM8014, AZ UM10M2, Shin Etsu ODL 102, or other similar commercially available materials from such vendors as JSR, TOK, Sumitomo, Rohm & Haas, etc. The OPL material can be deposited, for example, by spin coating. Other materials for the block 140 can include, but are not necessarily limited to, amorphous carbon, oxide, or any other material that retains etch selectivity to hardmasks 130 and substrate 101.

FIG. 3A is a cross-sectional view illustrating covering of NFET fins on a substrate in a method for manufacturing a semiconductor device, according to an exemplary embodiment of the present invention, and FIG. 3B is an enlarged view of the circled portion X in FIG. 3A, according to an exemplary embodiment of the present invention. FIG. 3B shows more clearly that the CD of a fin 120 is less than that of a fin 110. Referring to FIGS. 3C and 3D, in order to increase the CD of the fins 120, semiconductor layers 125, for example, SiGe, are epitaxially grown on exposed surfaces, including sidewalls of the fins 120 and on exposed surfaces of the silicon substrate 101. The enlarged view of the circled portion Y in FIG. 3D shows how the CD is increased on a fin 120 by the semiconductor layers 125. According to an embodiment, the semiconductor layers 125 can have the same SiGe composition as the fins 120, or have a different percentage of germanium than the fins 120. The hardmask caps 130 on the top surface of each fin 120 prevent vertical fin growth during epitaxy, and allow control over CDs of the fins to be used for the PFETs. Due to the {100} orientation of the fins 120, the semiconductor layers 125 are conformally grown to have the same or substantially the same thickness along the fins 120 instead of, for example, in a diamond shape where the semiconductor layer 125 would have different thicknesses along the height of a fin 120.

Referring to FIG. 3E, which is a cross-sectional view illustrating removal of a blocking material from NFET fins on a substrate in a method for manufacturing a semiconductor device, according to an exemplary embodiment of the present invention, the block 140 is removed after epitaxial growth of the semiconductor layers 125. According to an embodiment of the present invention, the block 140 can be stripped using, for example, oxygen plasma, nitrogen plasma, hydrogen plasma or other carbon strip process.

FIG. 4A is a top view, and FIGS. 4B and 4C are cross-sectional views taken along the lines C-C' and D-D' from FIG. 4A, illustrating formation of isolation and gate regions in a method for manufacturing a semiconductor device, according to an exemplary embodiment of the present invention. As shown in FIGS. 4A-4C, a plurality of gate structures 150 are formed around the fins 110, 120, and, according to an embodiment, spacers 160 are formed on sides of the gate structures 150. In accordance with an embodiment of the present invention, a dielectric layer 151 is formed under the gate structure. The dielectric layer 151 includes, for example, a high-K dielectric layer including, but not necessarily limited to, $HfO_2$ (hafnium oxide), $ZrO_2$ (zirconium dioxide), hafnium zirconium oxide, $Al_2O_3$ (aluminum oxide), and $Ta_2O_5$ (tantalum pentoxide) or other electronic grade (EG) oxide deposited on and around the fins 110, 120 and isolation regions 170. Examples of high-k materials also include, but are not limited to, metal oxides such as hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k material may further include dopants such as, for example, lanthanum and aluminum. According to an embodiment, the gate structure 150 includes a work-function metal (WFM) layer, including but not limited to, for a PFET, titanium nitride (TiN), tantalum nitride (TaN) or ruthenium (Ru), and for an NFET, TiN, titanium aluminum nitride (TiAlN), titanium aluminum carbon nitride (TiAlCN), titanium aluminum carbide (TiAlC), tantalum aluminum carbide (TaAlC), tantalum aluminum carbon nitride (TaAlCN) or lanthanum (La) doped TiN, TaN, which can be deposited on the dielectric layer 151. The gate structure 150 can further include a gate layer including, but not necessarily limited to, amorphous silicon (a-Si), or metals, such as, for example, tungsten, cobalt, zirconium, tantalum, titanium, aluminum, ruthenium, copper, metal carbides, metal nitrides, transition metal aluminides, tantalum carbide, titanium carbide, tantalum magnesium carbide, or combinations thereof deposited on the WFM layer and the dielectric layer 151. The gate structure 150 and dielectric layers 151 may be formed in a replacement metal gate (RMG) process using, for example, deposition techniques including, but not limited to, CVD, PECVD, radio-frequency CVD (RFCVD), physical vapor deposition (PVD), atomic layer deposition (ALD), molecular layer deposition (MLD), molecular beam deposition (MBD), pulsed laser deposition (PLD), and/or liquid source misted chemical deposition (LSMCD), sputtering, and/or plating, followed by a planarization process, such as, chemical mechanical planarization (CMP) to remove excess upper portions of the deposited layers.

A spacer layer is deposited and patterned by, for example, a reactive ion etch (RIE) to form spacer patterns 160 along sides of the gate structures 150. The spacer patterns 160 isolate the gate structures 150 from the source/drain regions on either side of gate structures 150. The spacer patterns 160 can include a dielectric insulating material such as, for example, silicon oxide, silicon nitride, silicon oxynitride, boron nitride, and/or silicon boron nitride. As shown in FIG. 4C, the spacer patterns 160 can be recessed to a height below a height of the gate structure 150.

Dielectric material, including, but not limited to silicon dioxide ($SiO_2$), low-temperature oxide (LTO), high-temperature oxide (HTO), flowable oxide (FOX) or some other dielectric, is deposited to form isolation regions 170, such as, for example, shallow trench isolation (STI) regions. The dielectric material can be deposited using deposition techniques including, but not limited to, CVD, PECVD, RFCVD, PVD, ALD, MLD, MBD, PLD, and/or liquid source LSMCD, sputtering, and/or plating, followed by a planarization process, such as, CMP to remove excess isolation material.

FIGS. 5A-5E are cross-sectional views illustrating epitaxial growth around fins in a method for manufacturing a semiconductor device, according to an exemplary embodiment of the present invention. Referring to FIGS. 5A-5E, following formation of the isolation, gate and spacer regions discussed in connection with FIGS. 4A-4C, epitaxial growth on the fins 110 and 120 in the source/drain regions adjacent the gate structure is performed. As can be seen from FIGS. 5A-5E, epitaxial growth for fins 110 corresponding to NFETs and for fins 120 corresponding to PFETs is performed separately, while the fins for the other type transistors are covered by blocks 145 and 147. The blocks 145 and 147 can comprise the same or similar materials as the block 140.

Referring to FIGS. 5A-5B, the fins corresponding to the NFETs are covered, and the material corresponding to the fins 120 (e.g., silicon germanium) is epitaxially grown on exposed surfaces, for example on silicon germanium surfaces of the fins 120 to conformally increase the sizes of the exposed portions of the fins 120. After epitaxial growth, the block 145 is removed. Referring to FIGS. 5C-5E, the fins corresponding to the PFETs, which were increased in size in the previous step, are covered, and the material corresponding to the fins 110 (e.g., silicon) is epitaxially grown on exposed surfaces, for example on silicon surfaces of the fins 110 to conformally increase the sizes of the exposed portions of the fins 110. After epitaxial growth, the block 147 is removed. According to an embodiment, the resulting fins 210, 220 after epitaxial growth have the same composition as the portions from where epitaxial growth occurs. According to an embodiment, the fins 220 can have a different percentage of germanium than the portions from where epitaxial growth occurs. Due to the {100} orientation of the fins 110, 120, the growth to result in the fins 210, 220 is conformal grown to have the same or substantially the same thickness on all sides instead of, for example, in a diamond shape with varying thicknesses.

As can be seen in FIGS. 5B-5E, growth is stopped prior to merging of the epitaxial region from each fin 210, 220 so that the fins do not contact each other through the epitaxial regions. According to an embodiment, the growth process is timed and stopped after a predetermined period to avoid merging. According to an embodiment, growth is performed with in-situ impurity doped silicon or in-situ impurity doped SiGe. For example, the epitaxial regions can be in-situ doped with, for example, boron for PFETs or Arsenic/Phosphorus for NFETs, or other appropriate impurity. In accordance with an embodiment of the present invention, in-situ doping can be performed with a doping level of about $1\times10^{20}$ to about $1.5\times10^{21}$ cm$^3$, for example, about $4\times10^{20}$ to about $8\times10^{20}$ cm$^3$.

Figure 6A:
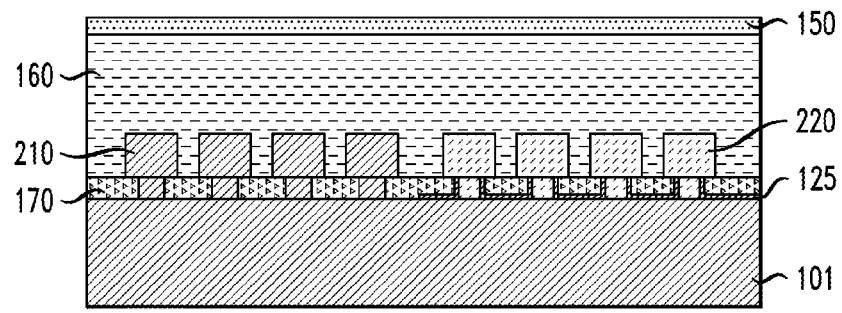
FIGS. 6A-6B are cross-sectional views illustrating contact formation in a method for manufacturing a semiconductor device, according to an exemplary embodiment of the present invention.
Figure 6B:
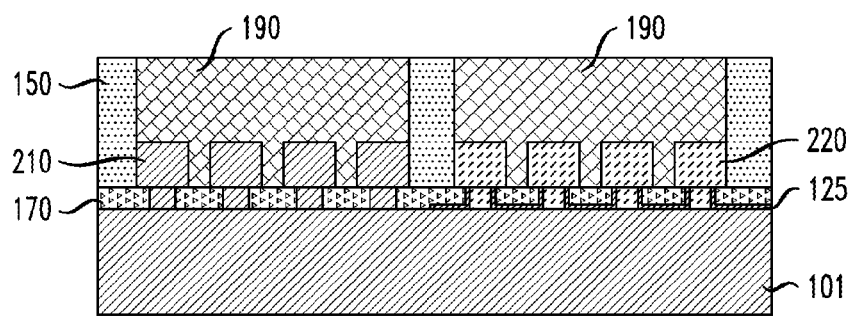
Figure 6C:
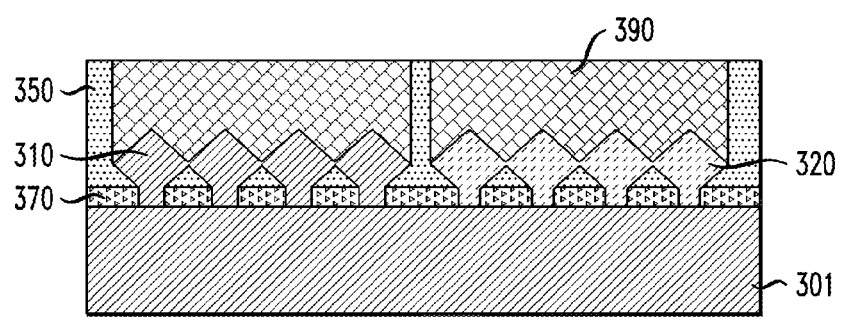
FIG. 6C is a cross-sectional view illustrating contact formation in a structure with non-conformal epitaxial growth.

FIGS. 6A-6B are cross-sectional views illustrating contact formation in a method for manufacturing a semiconductor device, according to an exemplary embodiment of the present invention. In accordance with an embodiment of the present invention, contact holes are etched in an inter-level dielectric and filled with a conductive material, such as metal, including, but not limited to, titanium, copper, to form contact bars 190 extending across multiple fins 210 and 220 in NFET and PFET regions. As noted above, due to the conformally grown epitaxial regions, the non-diamond like shapes of the fins 210, 220 permit contacts 190 to be landed between the fin structures 210, 220, thereby increasing surface area contact between channel regions and contact structures. More specifically, the fin structures 210 and 220 that are adjacent each other have adequate gaps between them to permit the contacts 190 to extend to the isolation layer 170. Referring to FIG. 6C, in contrast, non-conformal (e.g., diamond-like) shaped epitaxial regions 310, 320 formed via processing on a {110} orientation type substrate 301 may merge with each other, thereby preventing contact structures 390 from extending down to an isolation region 370 between adjacent fins. As a result, surface area contact between channel regions and contact structures is decreased in the structure of FIG. 6C relative to the structure shown FIG. 6B.

Although illustrative embodiments of the present invention have been described herein with reference to the accompanying drawings, it is to be understood that the invention is not limited to those precise embodiments, and that various other changes and modifications may be made by one skilled in the art without departing from the scope or spirit of the invention.

We claim:

1. A semiconductor device, comprising:
    a substrate having a {100} crystallographic surface orientation;
    a first plurality of fins comprising a first semiconductor material; and
    a second plurality of fins comprising a second semiconductor material different from the first semiconductor material, wherein:
       the first and second plurality of fins extend vertically with respect to the substrate;
       the second plurality of fins each comprise a conformal semiconductor layer on lateral sides thereof; and
       the first plurality of fins has the same or substantially the same lateral critical dimension as the second plurality of fins combined with the conformal semiconductor layer on the lateral sides thereof.

2. The semiconductor layer according to claim 1, wherein the conformal semiconductor layer extends onto the substrate adjacent each of the second plurality of fins.

3. The semiconductor layer according to claim 1, wherein a thickness of the conformal semiconductor layer on the lateral sides of a given fin of the second plurality of fins is the same or substantially the same as a difference between the lateral critical dimension of the first plurality of fins and the second plurality of fins.

4. The semiconductor device according to claim 1, wherein the first plurality of fins comprise silicon.

5. The semiconductor device according to claim 1, wherein the second plurality of fins comprise silicon germanium.

6. The semiconductor device according to claim 5, wherein the conformal semiconductor layer comprises silicon germanium.

7. The semiconductor device according to claim 6, wherein the conformal semiconductor layer comprises a different concentration of germanium than the second plurality of fins.

8. The semiconductor device according to claim 6, wherein the conformal semiconductor layer comprises the same silicon germanium composition as the second plurality of fins.

9. The semiconductor device according to claim 1, further comprising a gate structure on a portion of each of the first plurality of fins and the second plurality of fins.

10. The semiconductor device according to claim 1, further comprising a contact region between each of the first and second plurality of fins.

11. A semiconductor device, comprising:
    a substrate;
    a first plurality of fins comprising a first semiconductor material; and
    a second plurality of fins comprising a second semiconductor material different from the first semiconductor material, wherein:
       the first and second plurality of fins extend vertically with respect to the substrate;
       the second plurality of fins each comprise a conformal semiconductor layer on lateral sides thereof; and
       the first plurality of fins has the same or substantially the same lateral critical dimension as the second plurality of fins combined with the conformal semiconductor layer on the lateral sides thereof.

12. The semiconductor layer according to claim 11, wherein the conformal semiconductor layer extends onto the substrate adjacent each of the second plurality of fins.

13. The semiconductor layer according to claim 11, wherein a thickness of the conformal semiconductor layer on the lateral sides of a given fin of the second plurality of fins is the same or substantially the same as a difference between the lateral critical dimension of the first plurality of fins and the second plurality of fins.

14. The semiconductor device according to claim 11, wherein the first plurality of fins comprise silicon.

15. The semiconductor device according to claim 11, wherein the second plurality of fins comprise silicon germanium.

16. The semiconductor device according to claim 15, wherein the conformal semiconductor layer comprises silicon germanium.

17. The semiconductor device according to claim 16, wherein the conformal semiconductor layer comprises a different concentration of germanium than the second plurality of fins.

18. The semiconductor device according to claim 16, wherein the conformal semiconductor layer comprises the same silicon germanium composition as the second plurality of fins.

19. The semiconductor device according to claim 11, further comprising a gate structure on a portion of each of the first plurality of fins and the second plurality of fins.

20. The semiconductor device according to claim 11, further comprising a contact region between each of the first and second plurality of fins.

\* \* \* \* \*